United States Patent [19]

Mastrangelo

[11] Patent Number: 5,332,469
[45] Date of Patent: Jul. 26, 1994

[54] CAPACITIVE SURFACE MICROMACHINED DIFFERENTIAL PRESSURE SENSOR

[75] Inventor: Carlos H. Mastrangelo, Ann Arbor, Mich.

[73] Assignee: Ford Motor Company, Dearborn, Mich.

[21] Appl. No.: 14,025

[22] Filed: Feb. 5, 1993

Related U.S. Application Data

[63] Continuation-in-part of Ser. No. 974,570, Nov. 12, 1992, Pat. No. 5,258,079.

[51] Int. Cl.$^5$ .............. H01L 21/306; B44C 1/22; C03C 15/00; C23F 1/00
[52] U.S. Cl. ................... 156/643; 29/621.1; 73/718; 73/724; 156/644; 156/656; 156/657; 156/662; 437/228; 437/233; 437/901; 437/921
[58] Field of Search ............. 156/643, 628, 644, 648, 156/650, 656, 657, 659.1, 662; 73/715, 718, 720, 724, 726; 29/621.1; 338/4; 357/26; 437/228, 233, 241, 901, 919, 921

[56] References Cited

U.S. PATENT DOCUMENTS

| | | | |
|---|---|---|---|
| 3,539,705 | 11/1970 | Nathanson et al. | 174/68.5 |
| 3,846,166 | 9/1972 | Saiki et al. | 117/212 |
| 3,853,650 | 12/1974 | Hartlaub | 437/901 X |
| 4,740,410 | 4/1988 | Muller et al. | 428/133 |
| 4,744,863 | 5/1988 | Guckel et al. | 156/653 |
| 4,784,721 | 11/1988 | Holmen et al. | 156/647 |
| 4,849,070 | 7/1989 | Bly et al. | 156/643 |
| 4,975,390 | 12/1990 | Fujii et al. | 437/228 |

OTHER PUBLICATIONS

Arthur Adamson, "Physical Chemistry of Surfaces", 5th Edition, pp. 385-387.
Williams et al, "Wetting of thin layers of SiO2 by water", Applied Physics Letters, vol. 25, No. 10, Nov. 1974.
Scheeper et al, "Surface Forces in Micromachined Structures", Micromechanics Europe 1990, pp. 26-27.
Guckel et al, "Fabrication of Micromechanical Devices from Polysilicon Films with Smooth Surfaces", Sensors and Actuators, 20 (1989), pp. 117-122.
Orpana et al, "Control of Residual Stress of Polysilicon Thin Films by Heavy Doping in Surface Micromachining", Transducers '91, pp. 957-960.
Takeshima et al, "Electrostatic Parallelogram Actuators", Transducers '91, pp. 63-66 1991.
"Surface and Colloid Science", vol. 2, 1969, pp. 25-153.
Ishikura et al, "A Thin Film Capacitive Pressure Sensor", Technical Digest Of The 11th Sensor Symposium, 1992, pp. 149-152.
Article entitled "Capacitive Silicon Pressure Sensor Based on the One-Side Wafer Processing", by J. M. Lysko et al.; 1991 IEEE, pp. 685-688.
Article entitled "Capacitive Silicon Pressure Sensor Based on the One-Side Wafer Processing", by J. M. Lysko et al.; 1991 IEEE, pp. 685-688.

*Primary Examiner*—William Powell
*Attorney, Agent, or Firm*—Richard D. Dixon; Roger L. May

[57] ABSTRACT

A surface layer and a sacrificial layer are deposited on a substrate. A conductive structural layer bridges over the sacrificial layer and is anchored to the surface layer for creating paired conductive areas. A backside opening is etched in the substrate for defining a flexible diaphragm layer of reduced thickness. The sacrificial layer is removed so that pressures exerted on the backside opening will cause a change in capacitance between the paired conductive areas. Temporary posts support the conductive structural layer as the sacrificial layer is removed.

18 Claims, 5 Drawing Sheets

CAPACITIVE SURFACE MICROMACHINED DIFFERENTIAL PRESSURE SENSOR

This is a continuation-in-part application of patent application Ser. No. 07/974,570, filed on Nov. 12, 1992, now U.S. Pat. No. 5,258,079 having the title, DRY-RELEASE METHOD FOR SACRIFICIAL LAYER MICROSTRUCTURE FABRICATION.

BACKGROUND OF THE INVENTION

In order to build microstructures, a sacrificial layer first must be deposited on a substrate, and then a structural component or layer is deposited on the sacrificial layer. The sacrificial layer is then removed, leaving a substrate with a structural component attached to, but spaced from, the substrate. Two types of processes are currently used to remove the sacrificial layer. One type is the wet-release method, and the other type is the dry-release method. However, problems exist with each method.

In a typical wet-release method an etching solution or etchant is applied between the substrate and the structural layer to remove the sacrificial layer. Then, the sacrificial layer is rinsed away by a rinsing solution. As the etching and rinsing solutions evaporate from the small space between the structural layer and the substrate, strong capillary forces between the two are created. As the volume of liquid trapped beneath the structural layer decreases by evaporation, the capillary forces become stronger. As a result of these forces, the structural layer begins to deflect toward the surface of the substrate. If the capillary forces are strong enough, and the structural layer weak enough, the structural layer deforms to the point where it contacts the substrate. At that point, intersolid forces are the strongest, and the structural layer may be permanently pinned to the substrate. Therefore, a need exists for a method that prevents the destructive effects of the capillary forces associated with wet etching techniques.

To overcome the destructive effects of the capillary forces, dry-release methods have been developed. While the dry-release methods for removing sacrificial layers are not troubled by capillary forces, they have their own distinct drawbacks. For example, the dry-release method of Saiki in U.S. Pat. No. 3,846,166, requires deposition of a structural layer on a sacrificial resin layer. However, because the resin layer melts or degrades at low temperatures (e.g., 300°–400° C.) many desirable materials for the structural layer which require higher deposition temperatures cannot be deposited upon the fragile sacrificial resin layer. For example, polysilicon, a preferred material for microstructures, requires a temperature of about 600° C. for deposition.

Similarly, Bly in U.S. Pat. No. 4,849,070, teaches a dry-release method for removing a sacrificial layer in which the structural layer is built on top of a solid layer that can later be sublimed to free the structural layer. However, the choice of structural layer materials is again limited to lower temperature materials, as higher temperature materials cause the sublimable layer to disappear before deposition thereon. In addition, Bly teaches the production of permanent posts which support the structural layer above the substrate, and form part of the finished microstructure. However, the need exists in many applications for microstructures without such permanent posts.

Other dry-release methods known in the art include liquid freezing and sublimination methods and a photoresist refill and plasma-etching method. These methods also their own drawbacks and limitations under certain circumstances. Liquid freezing and sublimination methods may be unreliable and difficult to control. The freezing of the liquid between the structural layer and the substrate can result in an increase in volume which can fracture the microstructure. The photoresist refill and plasma-etching method is difficult to perform, primarily because time consuming and costly mixing of the solution are required.

Guckel et al. in U.S. Pat. No. 4,744,863 teaches the use of a piezoresistive sensor in conjunction with a cavity structure formed by depositing a polycrystalline silicon layer over a large silicon dioxide post or latice having smaller ridges leading outwardly from the central area to the lateral edges. The polysilicon layer is masked and etched to expose the lateral edges of the ridges, and then the entire structure is immersed in an etchant which will remove the ridges and the post but not the substrate. The cavity is then sealed by vapor deposition of polysilicon or silicon nitride. At column the concept of using capacitive deformation sensing is mentioned as an alternative, but is not taught.

SUMMARY OF THE INVENTION

Accordingly, it is a principal object of the present invention to provide a capacitive differential pressure sensor manufactured in accordance with a dry-release method for sacrificial microstructure fabrication that avoids the possible destructive effects of the capillary forces created as a result of the wet etching techniques, and uses a sacrificial layer upon which different structural layer materials may be deposited.

The dry-release method of the present invention produces temporary posts or columns that support the structural layer during the wet etching of the sacrificial layer. Preferably made of a polymer, the posts or columns prevent the structural layer from being pulled toward the substrate by capillary forces as the etching and rinsing solutions evaporate. Thus, deformation of the structural layer and undesirable permanent pinning of the structural layer to the substrate is avoided. The temporary posts or columns extend from the substrate to the structural layer during the wet etching staging, and, after removal of the sacrificial layer, are themselves removed by dry etching with plasma to produce a microstructure that contains no posts or columns. This step of dry etching the plasma requires no liquids. Therefore, capillary forces are not present, and additional supports are not needed during this step.

The method for fabricating the micromachined differential pressure sensor on a semiconductor substrate includes the steps of selectively implanting a doping material into the substrate to define a first etch-stop layer. A surface layer of semiconductor material is then deposited Over the substrate so as to cover the first etch-stop layer and thereby define a diaphragm area. A passivating conductive layer is deposited over the diaphragm area to form a diaphragm electrode. A sacrificial layer is selectively deposited on the diaphragm area, A conductive structural layer is anchored to the surface layer such that the sacrificial layer is located between the substrate and the structural layer so as to form a second electrode. The substrate is selectively etched from the side opposite the structural layer so as to form a backside aperture that terminates at the first etch-stop layer, The first etch-stop layer is then removed such that the backside aperture couples to the diaphragm layer. At least one temporary post formed for extending from the structural layer toward the surface layer for eliminating the deflection therebetween. The sacrificial layer is removed and then the temporary posts are removed. The resulting differential pressure sensor produces a variation in the output capacitance when a pressure is exerted through the backside aperture causing a deflection of the diaphragm and a corresponding change in the capacitance between the first and second electrodes. A reference capacitor constructed without a diaphragm is also provided on the substrate adjacent to the pressure sensor.

BRIEF DESCRIPTION OF THE DRAWINGS

Other objects, features, and advantages will be apparent from a study of the written description and the drawings in which.

DETAILED DESCRIPTION OF THE PREFERRED EMBODIMENT

The present invention relates to a capacitive surface micromachined sensor suitable for the measurement of liquid and gas pressures that can be manufactured without the use of wafer bonding techniques.

Figure 1:
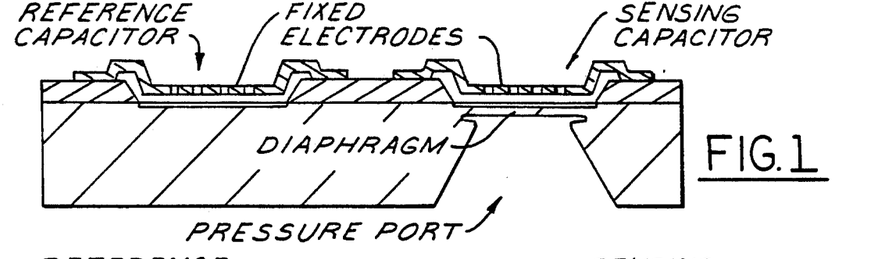
FIG. 1 is a frontal sectioned view through the substrate along section lines 1—1 of FIG. 2 showing the pressure and the reference sensor elements.

The present pressure sensor is optimized for the measurement of differential pressure of liquids such as engine, suspension, and transmission oil. As shown in FIG. 1, this design consists of a two-plate air dielectric capacitor. One plate is a diaphragm which is mechanically deformed by the pressure narrowing the gap and changing its capacitance. The pressure of the liquid is applied to the backside of the diaphragm through a pressure port. A matching capacitor is constructed adjacent to the transducer for the ratiometric measurement of the diaphragm deflection. This design uses a single crystal silicon diaphragm for the moving electrode and polycrystalline silicon for the stationary electrode. This design exploits the high quality and reproducibility of the mechanical properties of single crystal silicon for the analog diaphragm, and the versatility of polysilicon micromachining for the fabrication of suspended parts. The gap separation distance is less than a micrometer, which yields a device capacitance of a few picofarads. This capacitance is large enough to be sensed with off chip circuits.

Figure 2:
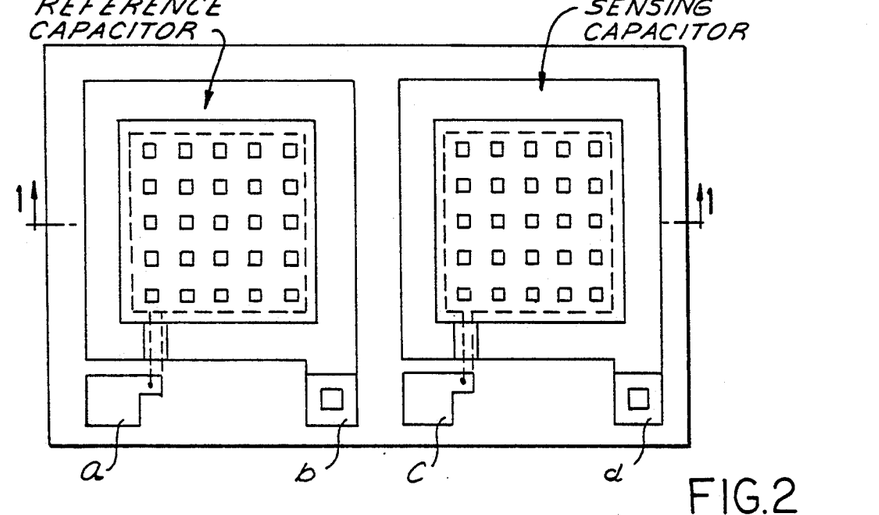
FIG. 2 is a top view of the differential pressure sensor.

As shown in FIG. 2, the four bonding pads a, b, c and d for the electrodes are located on the same side of the chip for easy interconnection to the detection circuit. These devices can be manufactured to meet a ±10% error specification in their capacitance to pressure characteristic without calibration. This manufacturing accuracy and reproducibility reduces the sensor cost significantly.

DESIGN EXAMPLE

For illustration purposes, the design for this device is illustrated in an engine oil pressure sensor application. There are four main design variables: the diaphragm width w, its thickness t, the electrode spacing d, and the stationary electrode thickness s. The sensor must satisfy several design criteria: a) the capacitance of the sensor must be above a specified minimum $C_{min}$; b) the device must have a full pressure range of $P_r$, and it must be able to withstand the overpressure $P_{ov}$; c) the pull-in voltage of the top polysilicon plate must be greater than $V_{pmin}$; and d) the variability of the load deflection curve subject to process variations must be below a threshold $\epsilon_o$. Furthermore, the area and cost must be minimized in order to minimize manufacturing costs.

The pressure design problems may be treated as an optimization problem with equality and nonequality constraints. Ignoring the residual stress, the equation that determines the center load deflection $z_m$ curve of the diaphragm are given by Eq. (11) and (12) (see below)

$$z_m \approx \frac{\alpha w^4 P}{D}, \quad D = \frac{Et^3}{12(1-\nu^2)} \tag{1}$$

where D is the flexural rigidity of the plate. To prevent the sticking of the diaphragm to the upper electrode, the air gap d is chosen such that at the full pressure range, the diaphragm barely touches the electrode. Thus $d = z_m(P_r)$ or $$d = \frac{\alpha w^4 P_r}{D} \tag{2}$$

The maximum stress in the diaphragm occurs at four midpoints of its edges. This must be smaller than the fracture stress $f$ at the overpressure $P_{ov}$, yielding a constraint in the aspect ratio of the diaphragm $$\left(\frac{w}{t}\right) \leq \sqrt{\frac{\sigma_f}{\beta P_{ov}}} \tag{3}$$

where $\beta$ is approximately equal to 0.31 and for single-crystal silicon $\sigma_f$ is approximately equal to 600 MPa as a safe value. The capacitance of the sensor is $$C = \frac{\epsilon_0 w^2}{d} \geq C_{min} \tag{4}$$

The pull-in voltage of the capacitor is the voltage at which the electrical force between the plates is strong enough to make the capacitor collapse. In this structure, the upper electrode is more compliant than the diaphragm, hence it determines this voltage. It can be shown that the pull-in voltage for a clamped elastic plate of thickness s is $$V_p \approx \frac{64}{7} \sqrt{\frac{E s^3 d^3}{5(1-\nu^2)w^4 \epsilon_o}} \geq V_{pmin} \tag{5}$$

Using Eq. (13) to (16) (see below) the total relative error of the maximum deflection is $$\epsilon_{zm} \approx \left( 16 \left( \frac{\Delta w}{w} \right)^2 + 9 \left( \frac{\Delta t}{t} \right)^2 + \left( \frac{\Delta d}{d} \right)^2 \right)^{\frac{1}{2}} \quad (6)$$

The minimization of device area is equivalent to that of its cost. This area accounts for the diaphragm area as well as the rim around it. The total chip area of the sensor plus reference capacitor is $$A_c = (\sqrt{2} \, t_w + 2r + c + w)(t_w/\sqrt{2} + 3r + c + 2w) \quad (7)$$

where $t_w$ is the wafer thickness, r is the outer rim of the chip, and c the dicing blade thickness. The actual optimization is best performed numerically; however, it is instructive to go through it in a graphical manner. Equation (2) eliminates one of the design variables, leaving only three. Also, Equation (5) indicates that the stationary electrode should be made as thick as possible to maximize the pull-in voltage. Thus, only two design variables remain, the diaphragm width w and its thickness t. The feasible design space can be plotted in the w−t plane of FIG. 3 by plotting the curves determined by the various constraints in this plane.

Figure 3:
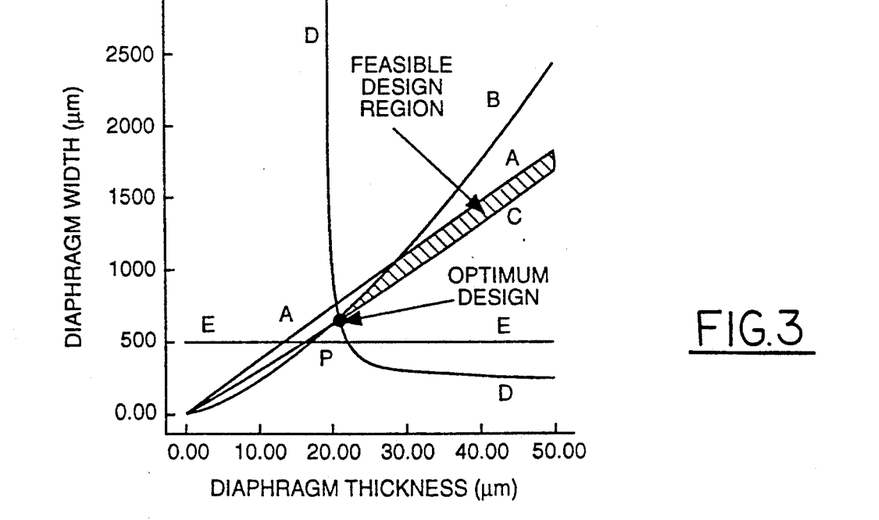
FIG. 3 is a chart showing the design optimization variables for the differential pressure sensor.

These curves are boundaries of the feasible design region. Equation (3) limits the feasible region to the points in the quadrant below the straight line A. The capacitance constraint of Equation (4) combined with Equation (2) yields the curve $$w = \sqrt{\frac{\epsilon E t^3}{12 \alpha C_{min} P_r (1 - v^2)}} \quad (8)$$

represented by the curve B. The pull-in voltage of Equations (5) and (2) yield the curve C $$w = \frac{(5\epsilon_0)^{1/8} (7 V_{pmin} E)^{1/4}}{(64)^{1/4} (1728 \alpha^3 s^3 P_r^3)^{1/8}} t^{9/8} \quad (9)$$

Finally, curve D is the contour of Equation (6) with $\epsilon_{zm} = \epsilon_O$. Additional constraints limiting the minimum allowed gap $d \geq d_{min}$ are imposed by curve E since from Equation (4) and thus, $$w = \sqrt{\frac{C_{min} d_{min}}{\epsilon_o}} \quad (10)$$

The shadowed area is the feasible design region, and the point P minimizes the total width (and cost) of the device while meeting all the constraints. Note that not all the constraints may be active since for some particular design parameters the constraints may land outside the boundaries of the feasible region.

For these particular devices, the diaphragm is 530 μm wide, and 19 μm thick, with a gap of 0.7 μm. The resulting capacitance is approximately 3.5 pF per device with a 0.8 pF full scale span and can measure pressures of up to 100 PSI. Each device, with matching capacitor, occupies a 2.6 mm² area, yielding approximately 3000 devices per each 100 mm wafer. This design procedure can be duplicated for other pressure ranges.

FABRICATION PROCESS EXAMPLE

Figure 4A:
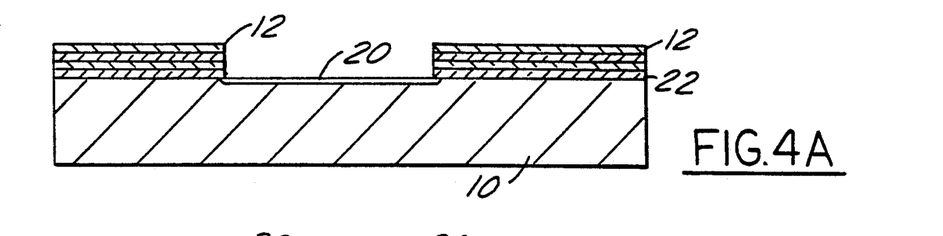
FIGS. 4A-4O illustrate frontal section views of the pressure sensor in accordance with the present invention.
Figure 4B:
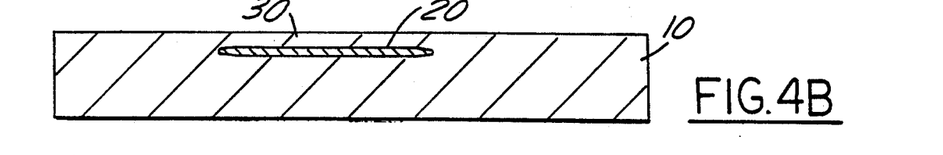

FIG. 4 illustrates the fabrication sequence of the preferred embodiment of the present invention, The process starts at FIG. 4A with a p-type silicon wafer 10 having a 100 crystal lattice orientation and with a boron concentration of $10^{15}$ cm$^{-3}$ The silicon first is etched about 1 μm deep using an $SF_6$ plasma..After removing the resist 12 and cleaning the sample in a piranha solution, the wafer is patterned again to define the p+ etch-stop area 20, A heavy dose of boron $2 \times 10^{16}$ cm$^{-2}$ with an energy of 100 KeV is ion implanted on the exposed areas 20, and then the wafers are cleaned with piranha. The samples are then given a short anneal at 900° C. for 30 minutes inca dry oxygen atmosphere to restore the crystalline structure of the ion-implanted regions. The thin oxide is then removed with 10:1 HF as shown in FIG. 4B.

Figure 4C:
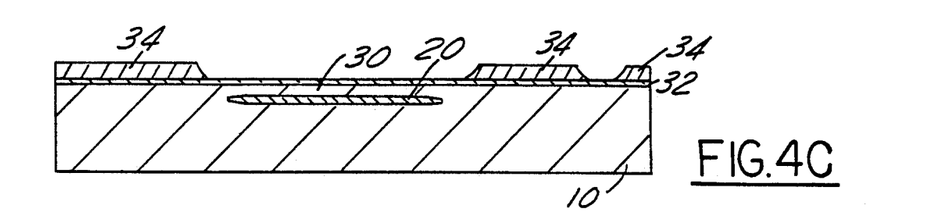

In the next step, a 19 μm thick layer of silicon 30 is epitaxially grown at a temperature of 1150° C. for about five minutes. The uniformity of the epi growth is better than 1%. This layer is in-situ p-type doped with a boron concentration of $10^{15}$ cm$^{-3}$. Next, the passivation layer 32 is grown for the top electrode. A layer of 3 μm of LPCVD low-temperature oxide (LTO) 34 is grown and patterned as shown in FIG. 4C. The LTO is etched in a 5:1 BHF etch solution until reaching the silicon surface, The samples are next implanted with $5 \times 10^{15}$ cm$^{-2}$ of arsenic to form the back electrode 40.

Figure 4D:
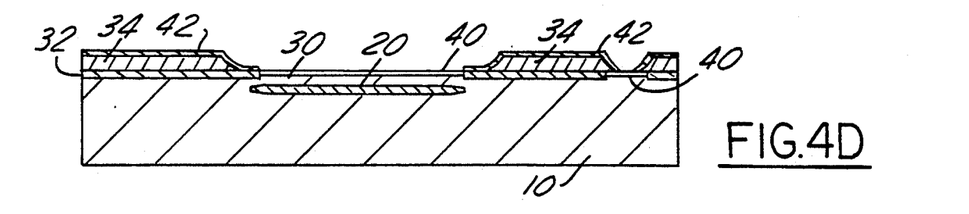

After photoresist removal and piranha cleaning, a thin 100 nm layer 42 of low-residual-stress LPCVD silicon nitride is grown on the upper surfaces as shown in FIG. 4D. The purpose of this layer is to protect the oxide passivation from the subsequent sacrificial etch and to serve as a mask layer for the backside port etch. A layer 0.5 μm. thick of LTO 50 is then grown and patterned in the plate area. This oxide layer acts as a mask for the nitride etch. A layer of photoresist 46 is also spun on the backside to protect it from the LTO etch. The LTO is etched with 5:1 BHF, and the samples are then cleaned. The underlying nitride is etched in a hot $H_3PO_4$ solution at 150° C. The samples are next immersed in a 5:1 BHF solution to remove the LTO mask.

Figure 4E:
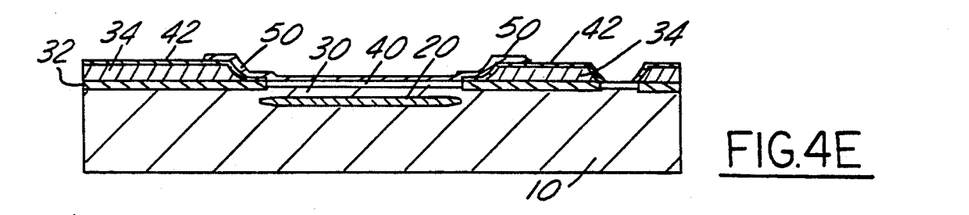

After wafer cleaning, a 0.7 μm thick layer of LTO 50 is grown for the interelectrode sacrificial oxide spacer. After performing the oxide lithography, the result is patterned with 5:1 BHF to obtain the structure of FIG. 4E. After removing the resist, the samples are cleaned in piranha solution, and a second 100 nm layer of low-stress nitride 52 is grown. This layer is a dielectric spacer that prevents the electrical contact of the capacitor electrodes in case of overpressure.

Figure 4F:
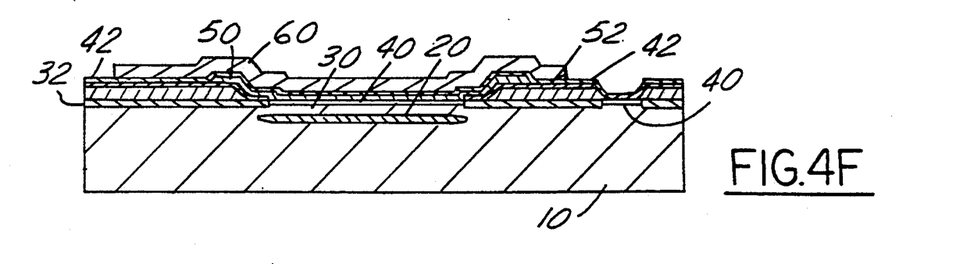

Next, a 2 μm layer of slightly tensile undoped polysilicon 60, which represents about one-half of the top electrode thickness, is deposited. The samples are then ion implanted with phosphorus with a dose of $10^{16}$cm$^{-2}$ to make the polysilicon conductive. After cleaning the samples in piranha, the remaining 2 μm of the top electrode layer 60 is grown, as shown in FIG. 4F. The wafer is then annealed at 900° C. for 30 minutes to activate the boron implant.

Figure 4G:
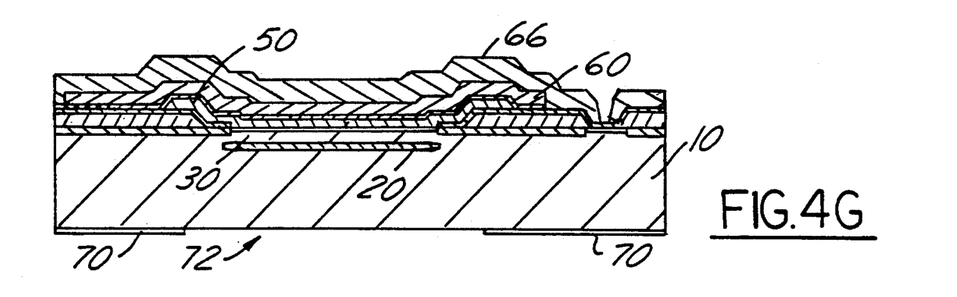

Next, the polysilicon electrode lithography is performed. The 4 μm thick polysilicon is wet etched in a 64:33:3 $HNO_3:H_2O:NH_4F$ solution until the nitride layer is reached. After this step, the wafers are cleaned, and a 1 μm thick LTO layer 66 is grown. Next, the back electrode contact hole lithography is performed and the substrate is etched as shown in FIG. 4G. The LTO layer protects the front side electrode from the backside diaphragm etch. After this step, the front side of the wafer is covered with a double layer of photoresist. The LTO on the backside is then removed in a 5:1 BHF solution. Next, the backside lithography is performed, and the backside nitride 70 is etched in a $SF_6$ plasma up to the silicon, thereby revealing the backside opening 72. The photoresist is then removed and the samples are piranha cleaned.

Figure 4H:
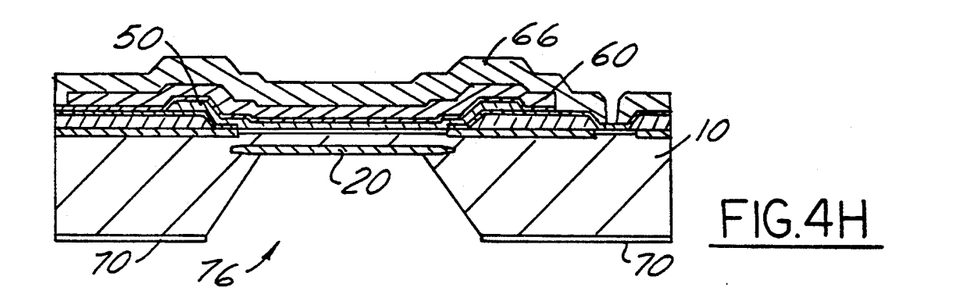
Figure 4I:
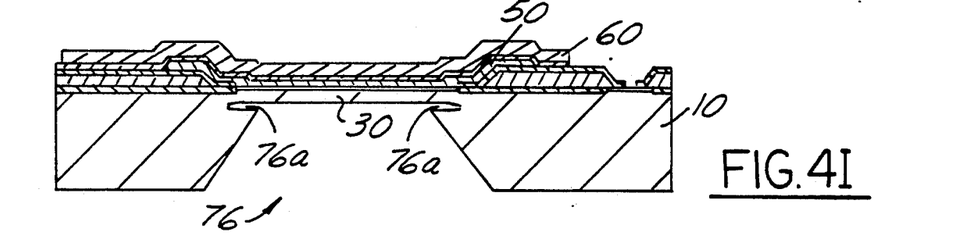

The wafers are then immersed in a 2% by Weight TMAWH anisotropic silicon etch solution (or others such as EDP, KOH) and heated to 80° C. for about 20 hours. This etch stops at the p+ buried layer 20 to define the backside aperture 76 as shown in FIG. 4H. After rinsing, the Samples are immersed in a 1:3:8 $HNO_3$:HF:$CH_3COOH$ solution which attacks the p+ layer 20 for about 15 minutes. The removal of the p+ layer 20 creates a recess notch or undercut area 76a that allows much more precise control of the diaphragm dimensions and performance. After piranha cleaning and rinsing, the samples are immersed in a hot $H_3PO_4$ bath to remove the nitride 70 in the contact hole and backside as shown in FIG. 4I. The samples then are immersed in 5:1 BHF to remove the protective LTO layer. The wafers are cleaned and given an anneal at 1000° C. for 30 minutes in $N_2$ to relax any remaining stresses in the diaphragm.

Figure 4J:
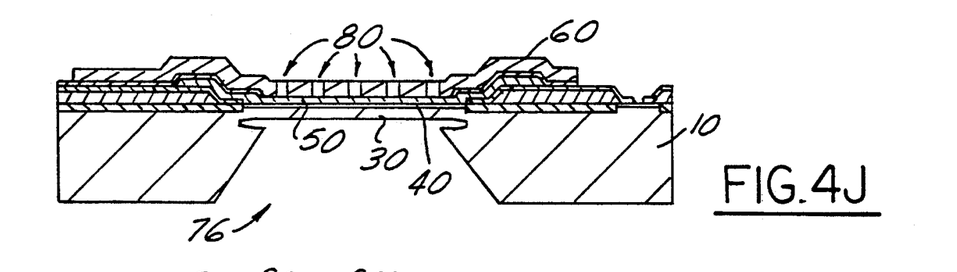
Figure 4K:
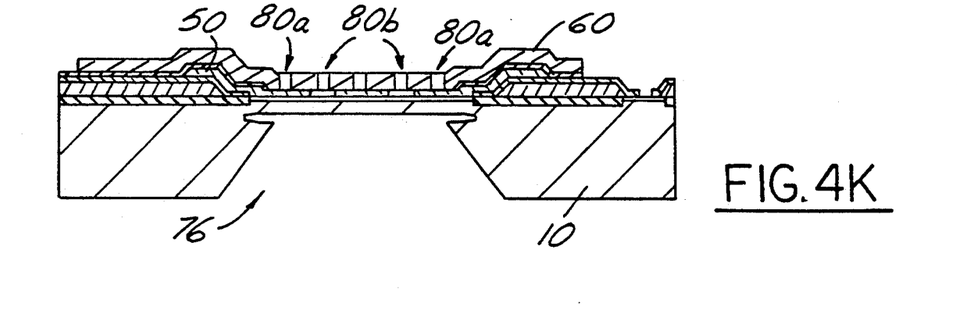
Figure 4L:
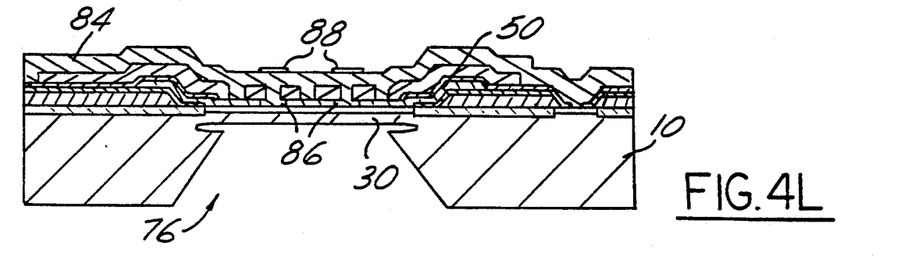

Next, the lithography of the etched plate holes 80 is performed. These holes. 80 are used to shorten the sacrificial etch time of the plate and to construct "feet" that hold the plate in position against the capillary pressure developed during the sacrificial etch. The electrode holes 80 are then etched in a $SF_6$:$C_2ClF_5$ plasma reactor up to the nitride layer 52. The nitride layer is then etched in $SF_6$ plasma until the oxide 50 is reached, as shown in FIG. 4J. Next, the photoresist is removed and the lithography for the support feet is performed. At this step, some of the electrode holes 80a will be covered by the resist. These are access holes for the sacrificial etch. The exposed holes 80b are used for the construction of the feet. The samples are then immersed in 5:1 BHF, and the sacrificial LTO is etched and undercut a short distance resulting in the structure of FIG. 4K. After this step the samples are piranha cleaned, and the feet are formed by first depositing a 5 μm layer of parylene-C84. Parylene is a polymer that is deposited from the gas phase. This polymer 84 refills the undercut, thereby forming a polymeric spacer 86 under the plate. After the deposition, a thin layer 100 nm thick layer of AlSi is evaporated on the samples. The aluminum is then patterned and etched as shown in FIG. 4L.

Figure 4M:
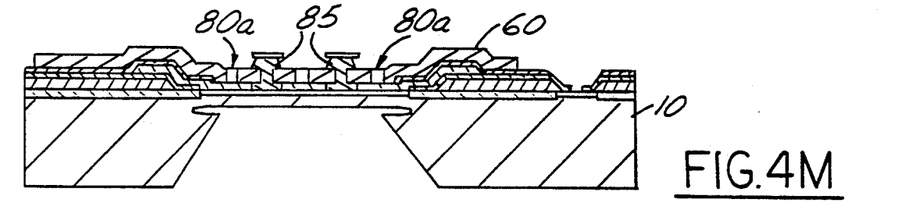

The wafer then is exposed to an oxygen plasma at 450 W for about 45 minutes. The thin aluminum serves as a mask 88 for the $O_2$ etch. After the etch, the samples are immersed in aluminum etchant, and the unprotected aluminum is stripped. The resulting structure is shown in FIG. 4M. Note that it consists of a Plate 88 on top of an oxide layer 60. The top electrode has access holes 80a for the sacrificial etch to remove its underlying LTO 60. In addition, the plate has parylene spacers 85 to keep it in position during the etch. After this step, the samples are immersed in a concentrated HF solution for five to ten minutes to remove the sacrificial LTO layer. The parylene feet prevent the top electrode from touching the diaphragm.

Figure 4N:
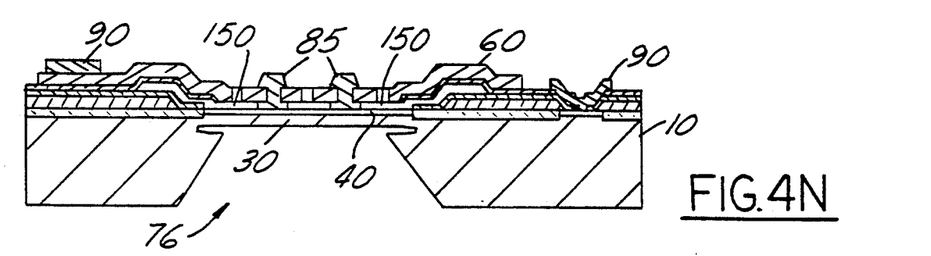

Next, a 1 μm AlSi layer 90 is Sputtered on the samples and the metallization lithography is performed. The metal is etched in aluminum etchant leaving the AlSi pads. After removing the photoresist in acetone, the final structure of FIG. 4N is obtained.

Figure 4O:
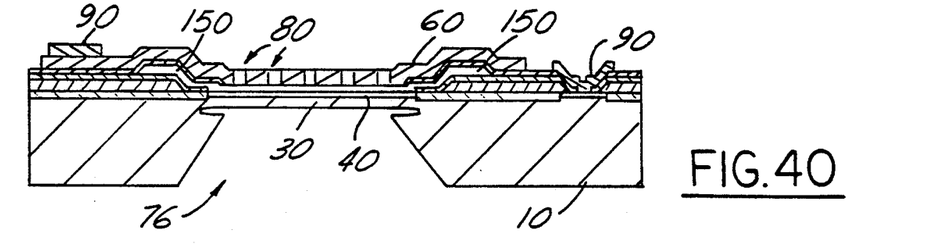
Figure 5:
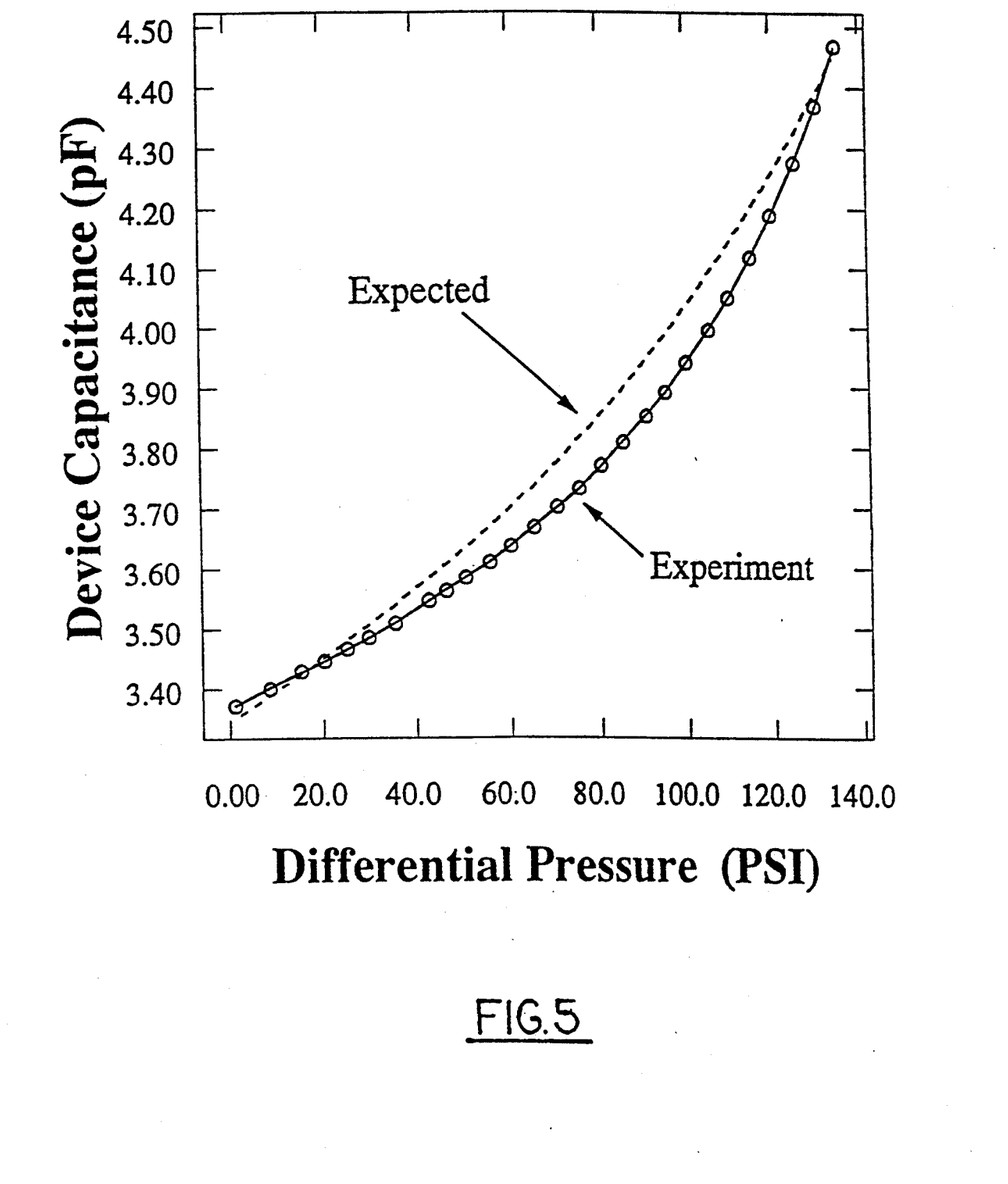
FIG. 5 illustrates the sensor transfer function.

Next, the samples are cleaved and the chips diced. After mounting, the packaged devices are placed in an oxygen plasma reactor for about one to two hours at 450 W to etch the parylene feet, hence releasing the top electrode. The finished device is shown in FIG. 4O, and a typical transfer function is shown in FIG. 5.

Considerations for Alternate Fabrication Processes

The sacrificial layer is selected from a group of sacrificial layer materials that can be removed by wet etching techniques. Further, the sacrificial layer must be compatible with the structural layer to be deposited thereon, and must withstand the temperatures required for deposition of the structural layer. As well, the sacrificial layer must not sublime at or below the temperature required for deposition of the structural layer. Illustrative of sacrificial layer materials is the preferred material, silicon dioxide.

The structural layer is deposited over the sacrificial layer in such a manner as to have at least one anchor leg, such as the corner of an edge, anchored to the substrate surface through an opening in the sacrificial layer.

The protective layer, which is resistant to sacrificial layer etchant, for example a protective polymer such as a photoresist polymer, is applied to the surface of the structural layer so as to cover at least one of the holes therein, while leaving at least one hole uncovered. The protective layer may be so applied by known deposition techniques, with at least one hole remaining uncovered by lithographic or other techniques known in the art. The structural layer is then preferably immersed in a sacrificial layer etchant solution to remove portions of the sacrificial layer where it is exposed through the uncovered hole of the structural layer. The partial etching of the sacrificial layer through the holes preferably extends to the substrate to excise void areas which may later be filled to form posts or columns. Preferably, the void areas include undercut areas in the sacrificial layer. The protective layer is then removed by methods known for the particular protective layer material chosen, such as by applying an etchant.

Generally, the column forming layer may be made of a material which is removable by a dry-release method. Preferably, the column forming layer is the conformal polymer, xylene, which can be vapor deposited to substantially fill the undercut area. A column forming layer is deposited into the void area and the undercut area to create polymeric posts or columns which are embedded in the sacrificial layer and will later provide support for the structural layer during wet etching of the remaining sacrificial layer. The void area may be formed with or without the preferred undercut area. Where the undercut areas are not present, the void areas will produce posts or columns which only overlap the top surface of the structural layer and support the structural layer by adhesion thereto. In this regard, the area of overlap may be varied to provide a greater or lesser surface area for adhesion, depending on the adhesive force required to support the structural layer.

The void areas also may be etched in the sacrificial layer to a depth less than the depth between the structural layer and the substrate. Posts or columns which extend from the structural layer short of the substrate may be formed thereby. During evaporation of the etching solution and rinsing solution, the structural layer will deflect somewhat, but will be stopped by the posts or columns before contacting the substrate. Shorter posts are not preferred, however, as the spacing between the posts must be closer, requiring more holes in the structural layer and making less free surface area available thereon for use.

A mask layer, such as a film of material resilient to plasma etching, is deposited in a pattern over portions of the column forming layer which cover the holes through which the void areas and undercut areas were filled. This may be achieved by depositing a film, as known in the art, by vapor or vacuum or other deposition techniques, and defining a pattern by lithographic or other known methods. Preferably, the mask layer is a film of aluminum or other conventional metal about 50-100 nanometers thick. The mask layer protects those portions of the first polymer layer covered by the pattern from etching and, once applied, unprotected portions of the column forming layer are removed by dry etching. Such as by oxygen plasma etching or other known methods.

While preferred embodiments of the invention have been shown and described herein, it will be understood that such embodiments are provided by way of example only. Numerous variations, changes and substitutions will occur to those skilled in the art without departing from the essence of the invention. Accordingly, it is intended that the appended claims cover all such variations as may fall within the spirit and scope of the invention.

I claim:

1. A method for fabricating a micromachined capacitive differential pressure sensor on a substrate, comprising the steps of:
   selectively implanting a doping material into the substrate so as to define a first etch-stop layer,
   depositing a surface layer of semiconductor material over the substrate so as to at least cover said first etch-stop layer for defining a diaphragm thereon,
   depositing a passivating conductive layer over said diaphragm to form a diaphragm electrode,
   selectively depositing a sacrificial layer over said diaphragm and said passivating conductive layer thereon,
   anchoring a conductive structural layer to said surface layer such that said sacrificial layer is located between the substrate and said structural layer so as to form a second electrode,
   selectively etching said substrate from the side opposite said structural layer so as to form an open backside aperture that terminates at said first etch-stop layer,
   selectively removing said first etch-stop layer such that such backside aperture couples to said diaphragm on the side opposite said structural layer,
   forming at least one temporary post extending through said structural layer toward said surface layer for reducing the deflection therebetween,
   removing said sacrificial layer so as to form a diaphragm cavity into which said diaphragm may deflect in response to the pressure to be measured, and
   removing said temporary posts,
   whereby pressure exerted through said backside aperture causes a deflection of said diaphragm and a corresponding change of the capacitance between said first and second electrodes.

2. The method of microstructure fabrication as in claim 1, wherein the step of forming at least one temporary post comprises the steps of:
   etching at least one hole in said structural layer,
   applying a selective etchant through said at least one hole to form a void area in said sacrificial layer,
   depositing a column forming layer resistant to the sacrificial layer etchant through at least one of said holes in said structural layer to substantially fill said void area and to form a post embedded in said sacrificial layer and supportingly coupled to said structural layer through said at least one hole, and then applying said column forming layer to at least a portion of said structural layer, and
   removing said column forming layer from said structural layer except where said column forming layer extends over said at least one hole.

3. The method of microstructure fabrication as in claim 2, wherein the step of removing said column forming layer from said structural layer comprises the steps of:
   depositing a film of material resistant to plasma etching in a pattern over the surface of said column forming layer, said pattern overlaying each of said holes through which the said column forming layer is disposed to substantially fill said void area;
   removing said column forming layer generally outside said pattern from said structural layer by plasma etching; and then
   removing said film of material in said pattern.

4. The method of microstructure fabrication as in claim 2, wherein said step of applying an etchant through said at least one hole includes forming a void area including an undercut area in said sacrificial layer.

5. The method of microstructure fabrication as in claim 2, wherein said step of applying an etchant through said at least one hole includes forming said void area extending from said hole in said structural layer to said substrate.

6. The method of microstructure fabrication as in claim 2, wherein said step of depositing a column forming layer resistant to said sacrificial layer etchant through said at least One hole includes the step of depositing a polymer by vapor deposition into said void area.

7. The method of microstructure fabrication as in claim 2, wherein said step of depositing a column forming layer resistant to said sacrificial layer etchant includes the step of depositing a conformal polymer.

8. The method of microstructure fabrication as in claim 2 wherein:
   said step of etching at least one hole comprises etching a plurality of holes in said structural layer; and
   said method further comprises the steps of:
      covering at least one of said plurality of holes with a protective layer resistant to sacrificial layer etchant; and
      after the step of applying an etchant through at least one hole to form said diaphragm cavity, removing said protective layer.

9. The method of microstructure fabrication as in claim 8 wherein:
   said step of depositing a structural layer comprises depositing a layer comprising polysilicon; and
   said step of covering at least one of said plurality of holes with a protective layer is performed by applying a photoresist polymer.

10. The method of microstructure fabrication as in claim 1, wherein said step of removing said temporary posts comprises the step of etching said temporary posts using a dry-etching method.

11. The method of microstructure fabrication as in claim 1, wherein said step of depositing said sacrificial layer includes the step of depositing a high-temperature resistant sacrificial layer capable of remaining substantially unaffected by temperatures of at least approximately 600° C.

12. The method of microstructure fabrication as in claim 2, wherein the step of selectively implanting said doping material further includes the step of sizing said etch stop layer to be approximately the size of said diaphragm but larger than a closed end of said backside aperture, thereby forming a recess notch adjacent to said diaphragm after the step of etching said backside aperture.

13. The method of microstructure fabrication as in claim 1, wherein the steps of depositing a surface layer, depositing a passivating conductive layer, selectively depositing a sacrificial layer, anchoring a conductive structural layer, forming at least one temporary post, removing the sacrificial layer, and then removing said temporary posts each further include corresponding steps for forming a matching reference capacitor on said substrate adjacent to but spaced laterally from said backside aperture.

14. A surface micromachined differential pressure sensor comprising:
a substrate,
a surface layer on one side of said substrate,
a pair of first conductive areas laterally adjacent to each other in said surface layer,
a pair Of bridging conductive layers, each coupled to said substrate and bridging over its corresponding one of said first conductive areas so as to form a capacitor therewith and a diaphragm cavity therebetween,
a backside aperture opening from the side of said substrate opposite from said one side and communicating into said substrate so as to define a flexible diaphragm layer of reduced thickness juxtaposed with said first conductive area,
whereby pressure exerted through said backside aperture results in a displacement of said flexible diaphragm causing a variation only in the capacitance between said bridging conductive layer and said first conductive area juxtaposed with said backside aperture.

15. The surface micromachined differential pressure sensor as described in claim 14, wherein each of said bridging conductive layers include at least two apertures therethrough for communicating into said diaphragm cavity therebetween.

16. The surface micromachined differential pressure sensor as described in claim 14, wherein said surface layer comprises polysilicon.

17. The surface micromachined differential pressure sensor as described in claim 14, further including:
a support post coupled through one of said apertures in said bridging conductive layers and extending through said diaphragm cavity to effectively abut with said substrate responsive to a deflection of said bridging conducting layer.

18. The surface micromachined differential pressure sensor as described in claim 17, wherein said supportive post is formed from a polymer removable by dry-etching techniques.

* * * * *